United States Patent [19]

Lim

[11] Patent Number: 5,729,156
[45] Date of Patent: Mar. 17, 1998

[54] ECL TO CMOS LEVEL TRANSLATOR USING DELAYED FEEDBACK FOR HIGH SPEED BICMOS APPLICATIONS

[75] Inventor: Hank H. Lim, Mountain View, Calif.

[73] Assignee: Micron Technology, Boise, Id.

[21] Appl. No.: 664,875

[22] Filed: Jun. 18, 1996

[51] Int. Cl.⁶ .................................................. H03K 19/0185
[52] U.S. Cl. ................................................. 326/73; 326/68
[58] Field of Search ........................... 326/68, 73, 74, 326/82, 86

[56] References Cited

U.S. PATENT DOCUMENTS

| | | | |
|---|---|---|---|
| 5,136,190 | 8/1992 | Chern et al. | 307/475 |
| 5,357,149 | 10/1994 | Kimura | 307/310 |
| 5,384,737 | 1/1995 | Childs et al. | 365/189.05 |
| 5,467,313 | 11/1995 | Jung et al. | 326/73 X |
| 5,606,268 | 2/1997 | Van Brunt | 326/68 |

*Primary Examiner*—David R. Hudspeth
*Attorney, Agent, or Firm*—Schwegman, Lundberg, Woessner & Kluth, P.A.

[57] ABSTRACT

A voltage level translator for converting a small-signal differential ECL input signal into a full rail, single-ended CMOS output signal, wherein the difference in current generated by a pair of P-channel transistors as a result in a transitioning of the ECL signal is "mirrored" by a pair of N-channel output transistors, causing the CMOS output voltage to transition, the delay in transitioning of the output transistors being minimized through the use of delayed feedback.

8 Claims, 3 Drawing Sheets

ECL TO CMOS LEVEL TRANSLATOR USING DELAYED FEEDBACK FOR HIGH SPEED BICMOS APPLICATIONS

FIELD OF THE INVENTION

The present invention relates to semiconductor integrated circuit devices, and, in particular, the invention relates to a voltage level translator for providing ECL to CMOS level translation using delayed feedback.

BACKGROUND OF THE INVENTION

There are instances in integrated circuit design wherein voltage level translators are needed to interface circuits requiring different voltage levels. For example, to minimize signal transmission time through data paths, many integrated circuit devices rely on emitter coupled logic (ECL) type voltage swings which are typically on the order of 800 millivolts. One application in which ECL type voltage signals are used in the data path is in static random access memory (SRAM) systems. Such systems include transistor-transistor-logic (TTL) SRAM devices functioning as input/output devices. Accordingly, at various points in the SRAM system, the ECL voltage levels must be converted to CMOS compatible voltages which typically swing between 3.3 volts and ground. However, a delay penalty is incurred in converting the ECL voltage levels to CMOS compatible voltage swings, rail-to-rail, to drive the TTL output. The reduction in time required to translate an input signal is an important objective of any voltage level translator.

In addition to the data paths of systems employing TTL I/O SRAM devices, ECL BiCMOS (Bipolar and CMOS) integrated circuits are faced with the same level conversion problem at the ECL receivers. Most BiCMOS SRAM devices use differential signaling in the data path. The data signal is referenced to the positive supply with a typical logic high level of Vcc-Vbe, where Vbe is the forward voltage drop of a bipolar transistor. The logic low level is typically Ve-Vbe-800 millivolts for a fully static design. Usually a current mirror arrangement is used to convert the small-signal differential input to a full rail single ended output.

One prior art implementation of small signal level translation in an SRAM memory system is disclosed in U.S. Pat. No. 5,384,737 which was issued on Jan. 24, 1995 to Lawrence F. Childs et al. FIG. 1, which is labeled "Prior Art", is a reproduction of an ECL to CMOS level translator that is contained in a collapse detector circuit that is illustrated in FIG. 11 of the referenced patent and which processes differential delayed clock signals. The ECL to CMOS level translator employs a current mirror arrangement in converting the small-signal differential input to a full rail single ended output. However, the field-effect transistor that functions as the constant current source acts as a static load, and the ECL input has a modest slew rate. Consequently, during transitioning, much of the current supplied to the output node is lost and considerable delay is introduced.

For the reasons stated above, and for other reasons stated below which will become apparent to those skilled in the art upon reading and understanding the present specification, there is a need in the art for a voltage level translator for providing ECL to CMOS signal level translation in circuits for reducing time required to translate an input signal and for minimizing the power requirements to complete signal level translations.

SUMMARY OF THE INVENTION

The present invention provides a voltage level translator for translating a small-signal, differential input signal to a large-signal, single-ended output signal, and which minimizes the transition time of the output signal provided by the voltage level translator. The voltage level translator comprises an input stage including first and second input transistors which receive respective complementary first and second portions of the differential input signal, the input first transistor having and an output connected to an intermediate node of the voltage level translator and the second input transistor having an output connected to an output node of the voltage level translator. The voltage level translator further includes an output stage including an output transistor and a control transistor. The control transistor has an output connected to the intermediate node. The output transistor has an input connected to the intermediate node and an output connected to the output node.

The control transistor and the output transistor are connected for operation as a current mirror, with the control transistor and the output transistor being responsive to a transition in a signal at the intermediate node to cause a transition in the output signal. In accordance with the invention, a signal feedback network couples the intermediate node to an input of the control transistor to delay the response of the control transistor to transitions in the signal at the intermediate node.

The voltage level translator is described with reference to an application as an ECL to CMOS level translator for high speed BiCMOS applications. The voltage level translator of the present invention, reduces the time and power required to translate an input signal by delaying the feedback signal that is applied to the control transistor thereby minimizing both the rising and the failing output transitions of the output signal.

DESCRIPTION OF THE PREFERRED EMBODIMENT

Figure 1:
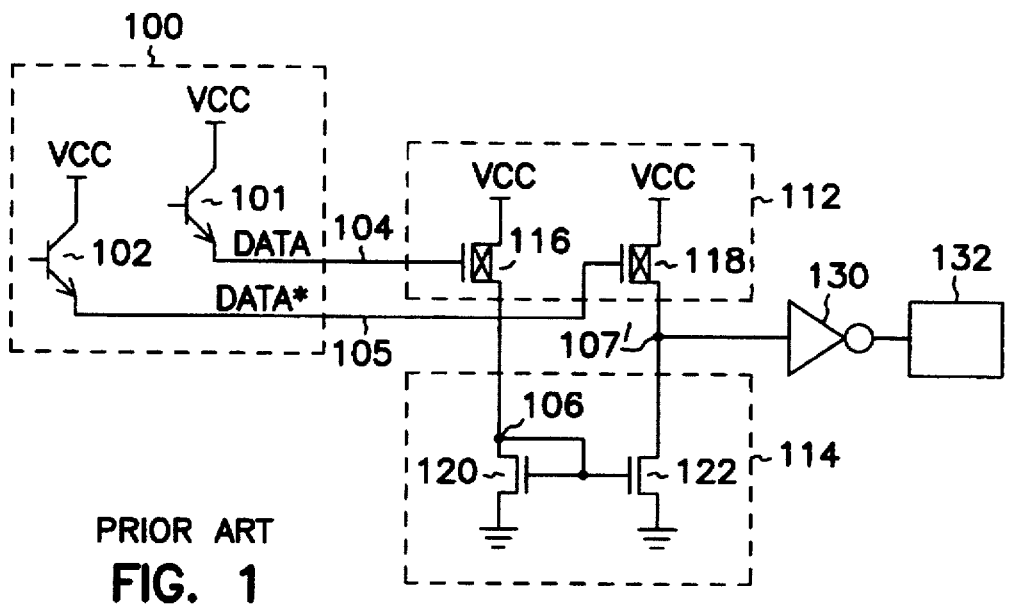
FIG. 1, which is labeled "Prior Art", is a schematic circuit diagram of a portion of a read control circuit of an SRAM type memory device including an ECL to CMOS voltage level translator.

In the following detailed description of the preferred embodiment, reference is made to the accompanying drawings which form a part hereof, and in which is shown by way of illustration a specific preferred embodiment in which the invention may be practiced. The preferred embodiment is described in sufficient detail to enable those skilled in the art to practice the invention, and it is to be understood that other embodiments may be utilized and that logical changes may be made without departing from the spirit and scope of the present inventions. The following detailed description is, therefore, not to be taken in a limiting sense, and the scope of the present inventions is defined only by the appended claims. In the drawing figures, elements having the same number perform essentially the same functions.

Each transistor of the voltage level translator described herein is either a P-channel or N-channel field-effect transistor (FET) having a gate, a first current node (drain) and a second current node (source). Since an FET is typically a symmetrical device, the true designation of "source" and "drain" is only possible once a voltage is impressed on the terminals. The designations of source and drain herein should be interpreted, therefore, in the broadest sense.

Figure 2:
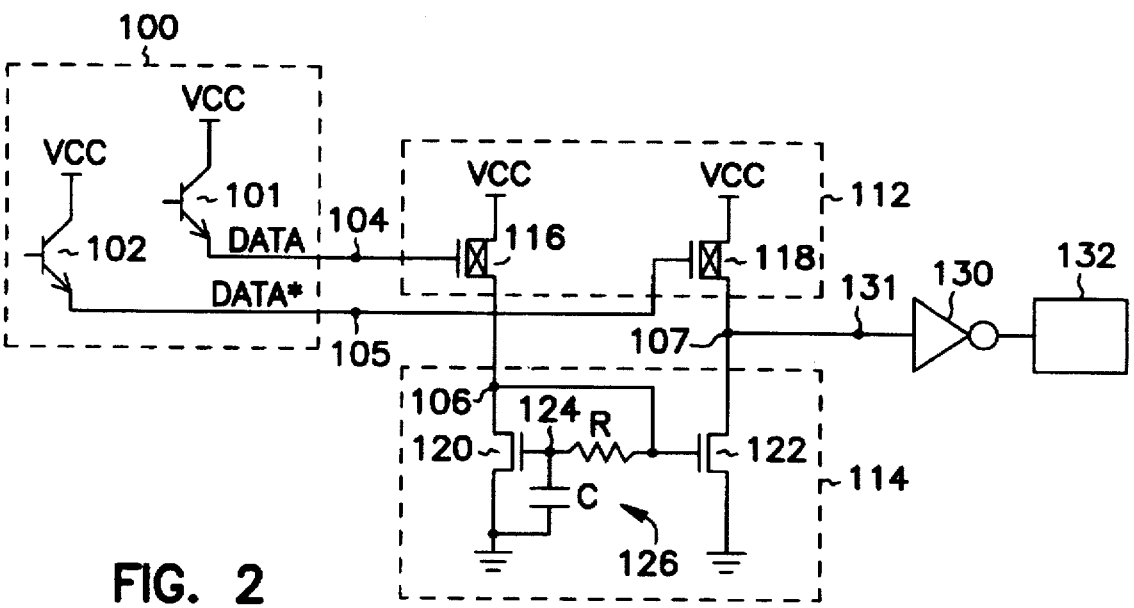
FIG. 2 is a schematic circuit diagram of a portion of a signal path of an ECL BiCMOS integrated circuit including an ECL to CMOS voltage level translator provided by the invention.

Referring to FIG. 2, there is illustrated a schematic circuit diagram of a portion of a signal path of an ECL BiCMOS integrated circuit including an ECL to CMOS voltage level translator provided by the invention. The voltage level translator can be used in any application where an ECL to CMOS voltage conversion is required, and in particular, in integrated circuit devices, such as memory circuits, which include ultra-high speed SRAM devices. The invention is described with reference to an application for providing voltage level translation in high speed BiCMOS applications which employ differential signaling in the data signal path. In the exemplary embodiment, a small signal differential input is provided to the voltage level translator from a differential output stage 100 of an ECL circuit, the output stage being represented by bipolar transistors 101 and 102. In one such application, the voltage level translator receives a small signal differential ECL input signal, including complementary signals DATA and DATA*, and converts the ECL signals to CMOS level signals. The asterisk (*) indicates that signal DATA* is the logical complement of the input signal DATA. Thus, when the signal DATA is at a logic high level, the signal DATA* is at a logic low level, and when the signal DATA is at a logic low level, the signal DATA* is at a logic high level. The signals DATA and DATA* are ECL voltage levels which have a swing of only 400 millivolts each, or a differential voltage of 800 millivolts.

In the exemplary embodiment, the voltage level translator has a first input node 104, a second input node 105, an intermediate node 106 and an output node 107. The voltage level translator includes an input stage 112 and an output stage 114. The input stage 112 includes a P-channel transistor 116 and a P-channel transistor 118. Transistor 116 has its gate connected to input node 104 to receive the signal DATA. The source of transistor 116 is connected to the supply voltage Vcc, and the drain of transistor 116 is connected to intermediate node 106. Transistor 118 has its gate connected to input node 105 to receive the signal DATA*. The source of transistor 118 is connected to the supply voltage Vcc, and the drain of transistor 116 is connected to output node 107.

The output stage 114 includes an N-channel transistor 120 and an N-channel transistor 122. Transistor 120 has its drain connected to intermediate node 106 and its source connected to a reference potential, such as ground. The gate of transistor 120 is connected to a node 124 which, in turn, is coupled through a resistor R to intermediate node 106 and to ground through a capacitor C. The resistor R and the capacitor C form a signal feedback network 126. Transistor 122 has its drain connected to the output node 107 and its source connected to a reference potential, such as ground. The gate of transistor 122 is connected directly to intermediate node 106.

The voltage level translator provides an optional inverter 130 having an input 131 connected to the output node 107 to receive the CMOS output voltage signal provided by the voltage level translator. The output signal from the voltage level translator, or the inverter 130 when provided, is connected to a functional circuit 132. The functional circuit 132 can be any variety of circuits including but not limited to isolation circuitry, row or address decoders, or level translated devices.

The ECL to CMOS voltage level translator provided by the invention provides delayed feedback in controlling the operation of transistor 120, which, in turn, controls output transistor 122. Transistor 120 and transistor 122 are connected for operation as a "current mirror", whereby current flowing through the control transistor 120 of the current mirror is "mirrored" or forced to flow through the output transistor 122. The delayed feedback is provided by the signal feedback network 126 formed by resistor R and a capacitor C, which are connected in a feedback path between the gate and the drain of transistor 120. The delayed feedback provided by the feedback network 126 delays the response of transistor 120 to the signal at intermediate node 106, allowing transistor 122 to more quickly follow transitions in the signal at node 106 resulting from transitioning of the signal DATA between logic high and low levels, thereby allowing the current that is generated in response to transitions of the signal DATA to be supplied to the output of the circuit.

Figure 3:
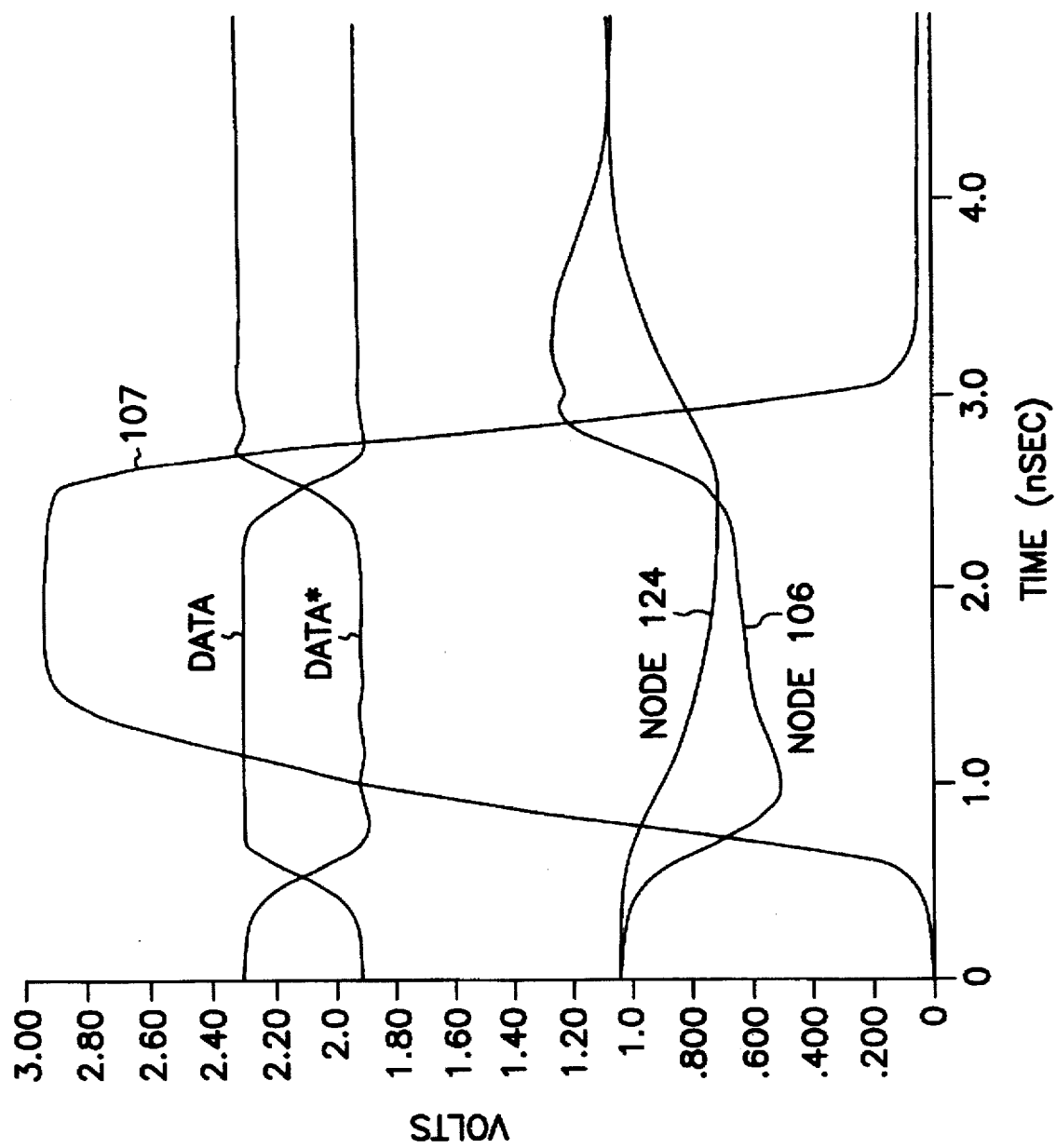
FIG. 3 is a timing chart illustrating the signal levels for the voltage level translator provided by the invention.

Referring additionally to the timing diagram of FIG. 3, which illustrates voltages occurring at various points in the voltage level translator as a function of time, the operation of the voltage level translator provided by the invention will be described. In the exemplary embodiment, a logic high level for the ECL input signals DATA and DATA* is approximately 2.3 volts. A logic low level for the ECL input signals DATA and DATA* is approximately 1.9 volts. A logic high level for the CMOS output signal is Vcc, which is 3 volts. A logic low level for the CMOS output signal is 0 volts or ground.

Assuming initially, that at time t=0, the input signal DATA at input node 104 is at a logic low level, and complementary signal DATA* at input node 105 is at a logic high level. Thus, transistor 116 is conducting, or "on", and transistor 118 is non-conducting, or "off". The voltage level at intermediate node 106 is approximately 1.05 volts. Consequently, transistor 122 is conducting, extending ground to the output node 107.

When the state of signal DATA transitions from a logic low level to a logic high level, the signal DATA* transitions from a logic high level to a logic low level. As the voltage at the gate of transistor 116 increases towards 2.3 volts, transistor 116 becomes non-conducting, causing the voltage level at intermediate node 106 to decrease. Likewise, because the state of the input signal DATA* is transitioning from logic high to logic low, the voltage at the gate of transistor 118 decreases towards 1.9 volts, causing transistor 118 to conduct, pulling node 107 towards Vcc. As transistor 116 begins to conduct less, the voltage level at the intermediate node 106, and thus at the gates of transistor 120 and transistor 122, begins to decrease.

Initially, the voltage level at intermediate node 106 is pulled down rapidly and, after approximately 1 nanosecond, reaches its minimum value of about 0.5 volts so that transistor 122 is biased on. However, because of the presence of the feedback network 126, the voltage level at node 124, and thus at the gate of transistor 120, can decrease independently of the voltage level at the intermediate node 106 because the resistor R of the signal feedback network isolates the gate of transistor 120 from the gate of transistor 122, and capacitor C initially maintains the potential at node 126 at 1.1 volts, and during this 1 nanosecond time interval, the voltage level at the gate of transistor 120 decreases only to about 0.9 volts. At about 1 nanosecond, the voltage level at intermediate node 106 begins to increase and at about 2.5 nanoseconds, the voltage level at intermediate node 106 becomes approximately equal to the voltage level at node 124, and thus to the voltage level at the gate of the transistor 120.

The voltage at the gate of the transistor 122 follows the voltage at the intermediate node 106, and thus, transistor 122 is rapidly biased off while transistor 118 is being biased on by the input signal DATA*. Consequently, the voltage level at output node 107 is pulled up to the supply voltage Vcc, providing a logic high level output for the voltage level translator.

At approximately 2.6 nanoseconds, the input signal DATA transitions from a logic high level to a logic low level, and the complementary state signal DATA* transitions from a logic low level to a logic high level. As the state of the input signal DATA transitions from a logic high level to a logic low level, the voltage at the gate of transistor 116 decreases towards 1.9 volts. This causes transistor 116 to conduct more, driving the voltage at intermediate node 106 towards 1.3 volts. Moreover, because the state of the input signal DATA* transitions from a logic high level to a logic low level, the voltage at the gate of transistor 118 increases towards 2.3 volts, causing transistor 118 to conduct less, which allows the output node 107 to be pulled down toward ground. As transistor 116 conducts more, the voltage level at the intermediate node 106 increases, causing the voltage at the gate of transistor 122 to increase and reaches a maximum value of about 1.3 volts at approximately 2.9 nanoseconds, turning off the transistor 122. However, because of the presence of the signal feedback network 126, the voltage level at node 124, and at the gate of transistor 120, increases at a slower rate, independently of the voltage level at intermediate node 106, and during this time interval, the voltage level at node 124 has increased only to about 0.8 volts. The voltage level at node 124 becomes approximately equal to the voltage level at intermediate node 106 at about 4 nanoseconds.

Referring now to FIG. 1, the prior art voltage level translator is similar to the voltage level translator of FIG. 2, and elements of the prior art voltage level translator have been given the same reference number as corresponding elements of the voltage level translator of FIG. 2, except that the output node has been given the reference numeral 107'. For a high-to-low transition of the signal DATA, the difference in current generated by the P-channel transistors 116 and 118 of the prior art circuit, and "mirrored" by the N-channel transistors 120 and 122, causes the voltage at the output node 107' to transition between Vcc and ground, which is the CMOS logic low voltage level. However, because transistor 120 functions as a static load, and because the signal DATA has a relatively modest slew rate, much of the current supplied to the output node 107' is lost. Stated in another way, without the delayed feedback provided by the present invention, when voltage level at the intermediate node 106 begins to increase in a positive direction, transistor 120 would be driven on harder, pulling the voltage at the intermediate node 106 down towards ground, delaying the transition in state of the output signal, because the gate of transistor 120 is connected directly to intermediate node 106 in the prior art circuit.

Figure 4:
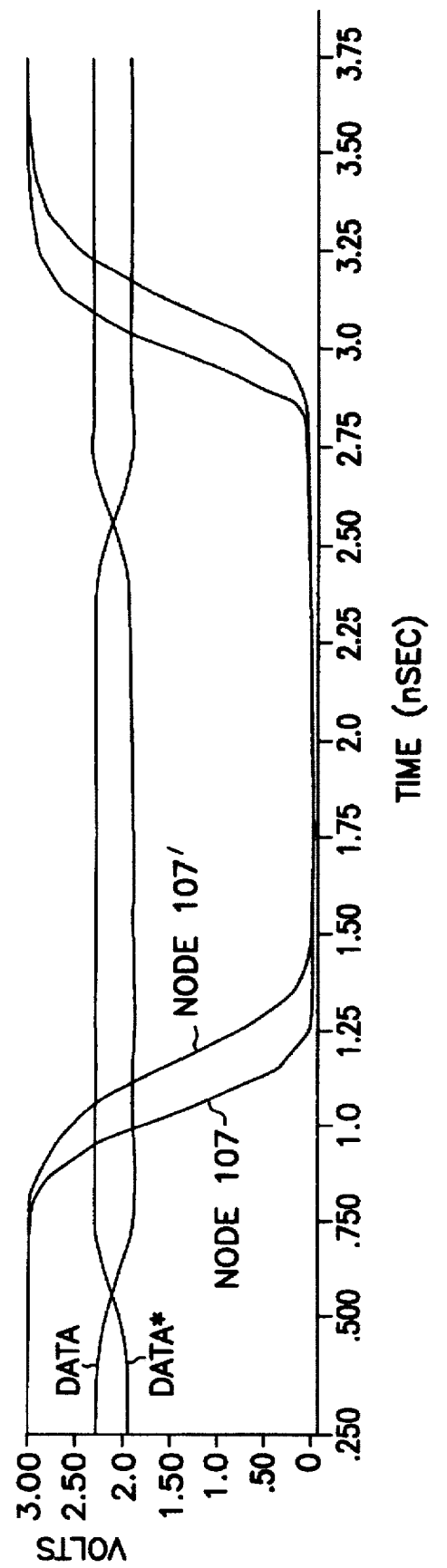
FIG. 4 is a timing chart illustrating the rising and falling output signal transitions for the voltage level translator provided by the invention and the prior art voltage level translator of FIG. 1.

FIG. 4 illustrates the results of a computer simulation of the voltage level translator illustrated in FIG. 2, which is provided by the invention and which includes the feedback network 126, in comparison with the prior art voltage level translator shown in FIG. 1 and which does not include such a feedback network. The circuit simulation was conducted using an HSPICE simulator. The simulation results from the prior art voltage level translator are overlayed with the simulation results from the voltage level translator according to the invention for ease in comparing the results of the two voltage level translators to illustrate the improved performance of the voltage level translator provided by the invention. The voltage level translators simulated were optimized designed for balance rise and fall times. Moreover, the voltage level translators were sized such that both voltage level translators consumed the same supply current to provide a fair comparison of response. For the voltage level translators that were tested, the supply voltage Vcc was equal to 3 volts and the temperature was 95° C.

In FIG. 4, the output voltage for one exemplary embodiment of the voltage level translator of FIG. 2 provided by the invention is indicated by the label "node 107", whereas the output voltage provided by the prior art voltage level translator of FIG. 1 is indicated by the label "node 107'". As can be seen from the circuit simulation of FIG. 4, for a falling output transition, the voltage level translator provided by the invention provides a reduction in the propagation delay of approximately 150 picoseconds, measured at 1.5 volts, which is the midpoint of the Vcc to ground transition, as indicated by the arrows 142, as compared to the prior art voltage level translator. Similarly, for a rising output transition, the reduction in the propagation delay for the voltage level translator provided by the invention is approximately 120 picoseconds, measured at 1.5 volts, which is the midpoint of the Vcc to ground transition, as indicated by the arrows 144. The increased speed is attributed to the function of the feedback network 126 that permits the voltage level at intermediate node 106, and, thus at the gate of output transistor 122, which controls the transitioning of the output signal, to rapidly transition. In the prior art voltage level translator shown in FIG. 1, wherein the transistor 120 has its gate connected directly to its drain, the result is that the voltage level at the intermediate node 106, as fed back to the gate of transistor 120, tends to maintain the transistor 120 on during positive-to-negative transitions, and to maintain the transistor 120 off during negative-to-positive transitions, preventing rapid transitioning of the output signal. The reduction in delay provided by the voltage level translator according to the invention provides is on the order of one to two hundred picoseconds. A delay reduction of several hundred picoseconds can be critical for deep-submicron, ultra-high speed SRAM devices.

Thus, it has been shown that the voltage level translator provided by the invention uses delayed feedback in CMOS voltage level conversion, providing increased data path speed. The voltage level translator provided by the invention is characterized by minimum propagation delay for maximum speed and has minimum power dissipation in order to promote long term operating reliability while providing optimum performance.

What is claimed is:

1. A voltage level translator for translating a small-signal, differential input signal to a large-signal, single-ended output signal, said differential input signal including first and second complementary input signal portions, said voltage level translator comprising:

an input stage including a first input transistor having an input connected to receive said first input signal portion, and an output coupled to an intermediate node; and a second input transistor having an input connected to receive said second input signal portion and an output coupled to an output node;

an output stage including an output transistor having an input coupled to said intermediate node, and an output coupled to said output node; and a control transistor having an output coupled to said intermediate node and an input; said control transistor and said output transistor being connected for operation as a current mirror, and said control transistor and said output transistor being responsive to a transition in a signal at said intermediate node to cause a transition in the output signal; and a signal feedback network for coupling said intermediate node to said input of said control transistor for delaying the response of said control transistor to transitions in said signal at said intermediate node.

2. The voltage level translator according to claim 1, wherein said feedback network includes a resistor electrically connected between said input of said control transistor and said intermediate node, and a capacitor electrically connected between said input of said control transistor and a reference potential.

3. The voltage level translator according to claim 1, wherein said first input transistor comprises a p-channel transistor having a gate connected to said first input, a source connected to a supply voltage and a drain connected to said intermediate node; and said second input transistor comprises a further p-channel transistor having a gate connected to receive said second input signal portion, a source connected to said supply voltage and a drain connected to said output node.

4. The voltage level translator according to claim 1, wherein said output transistor comprises a first n-channel transistor having a gate connected to said intermediate node, a source connected to a reference potential and a drain connected to said output node; and wherein said control transistor comprises a further n-channel transistor having a source connected to a reference potential, a drain connected to said intermediate node and a gate coupled to said intermediate node through said feedback network.

5. The voltage level translator according to claim 1, wherein said input signal is an ECL signal that swings between about 400 millivolts, and wherein said output signal is a CMOS signal that swings between a supply voltage Vcc and ground.

6. A voltage level translator for translating a small-signal differential input signal to a single-ended output signal, said differential input signal including first and second complementary input signal portions, said voltage level translator comprising:

a first input node connected to receive said first input signal portion, a second input node connected to receive said second input signal portion, and an output node;

a first transistor having a gate coupled to said first input node, a source coupled to a supply voltage and a drain coupled to an intermediate node;

a second transistor having a gate coupled to said second input node, a source coupled to said supply voltage and a drain coupled to said output node;

a third transistor having a gate coupled to said intermediate node, a source coupled to ground and a drain coupled to said output node;

a fourth transistor having a source coupled to ground, a drain coupled to said intermediate node and a gate; and a signal feedback network for coupling the gate of said third transistor to said intermediate node, said signal feedback network being interposed between the gate of said fourth transistor and the gate of said third transistor.

7. The voltage level translator according to claim 6, wherein said feedback network includes a resistor electrically connected between the gate of said fourth transistor and said intermediate node, and a capacitor electrically connected between the gate of said fourth transistor and a ground.

8. In a voltage level translator for translating a small-signal, differential input signal to a large-signal, single-ended output signal, said differential input signal including first and second complementary input signal portions, the voltage level translator including a first input transistor having an input connected to receive said first input signal portion and an output connected to an intermediate node; a second input transistor having an input connected to receive said second input signal portion and an output coupled to an output node; an output transistor having an input coupled to said intermediate node and an output coupled to said output node; and a control transistor having an input coupled to said intermediate node and an output; wherein said control transistor and said output transistor are responsive to a transition in a signal at said intermediate node to cause a transition in the output signal; a method for minimizing the transition time of the output signal, said method comprising:

interposing a signal feedback network between the gate of said control transistor and said intermediate node for coupling said input of said control transistor to said intermediate node to thereby delay the response of said control transistor to transitions in said signal at said intermediate node.

* * * * *